United States Patent
Lee (10) Patent No.: US 8,791,731 B2
(45) Date of Patent: Jul. 29, 2014

(54) RESET CIRCUIT AND METHOD OF PORTABLE TERMINAL

(75) Inventor: Woo Cheol Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/421,017

(22) Filed: Mar. 15, 2012

(65) Prior Publication Data

US 2012/0235715 A1  Sep. 20, 2012

(30) Foreign Application Priority Data

Mar. 15, 2011 (KR) .................. 10-2011-0022868

(51) Int. Cl.
*H03L 7/00* (2006.01)
*H03K 17/22* (2006.01)

(52) U.S. Cl.
CPC .......... *H03K 17/22* (2013.01); *H03K 2017/226* (2013.01)
USPC ............................. 327/142; 327/143; 327/198

(58) Field of Classification Search
USPC ................. 327/142, 143, 198, 141, 144–163; 331/1 A, 15–17; 375/373–376
See application file for complete search history.

(56) References Cited

U.S. PATENT DOCUMENTS

| 5,513,358 A * | 4/1996 | Lundberg et al. ............. 713/330 |
| 7,184,798 B1 * | 2/2007 | Brown et al. ................. 455/574 |
| 2010/0141320 A1 * | 6/2010 | Lin et al. ....................... 327/198 |
| 2012/0075005 A1 * | 3/2012 | Flores et al. .................. 327/512 |
| 2012/0306550 A1 * | 12/2012 | Jin et al. ....................... 327/143 |

* cited by examiner

*Primary Examiner* — Brandon S Cole (74) *Attorney, Agent, or Firm* — Jefferson IP Law, LLP (57) ABSTRACT

A reset circuit and a reset method of a portable terminal are provided. The reset circuit of a portable terminal includes an input unit for generating a certain input signal for reset according to a user input, a reset unit for generating a manual reset input signal according to an input of the certain input signal, for performing a control operation to cut-off power to be supplied to a Power Management IC (PMIC) using a signal generated during an operation maintenance time interval of the portable terminal and the manual reset input signal, and for performing a control operation to resupply the power to the PMIC according to an input signal from the input unit or completion of a preset timer, and a power supply unit for supplying the power.

20 Claims, 4 Drawing Sheets

RESET CIRCUIT AND METHOD OF PORTABLE TERMINAL

PRIORITY

This application claims the benefit under 35 U.S.C. §119 (a) of a Korean patent application filed on Mar. 15, 2011 in the Korean Intellectual Property Office and assigned Serial No. 10-2011-0022868, the entire disclosure of which is hereby incorporated by reference.

BACKGROUND OF THE INVENTION

1. Field of the Invention

The present invention relates to a reset circuit included in a portable terminal. More particularly, the present invention relates to a reset circuit included in a portable terminal, the reset circuit enabling a portable terminal having a Power Management IC (PMIC) to which a manual reset function is not supported to perform a manual reset function in addition, the present invention relates to a reset method for a portable terminal having a PMIC to which a manual reset function is not supported.

2. Description of the Related Art

A portable terminal has various functions such as a function for having a video call, an electronic organizer function (e.g., a calendar application), an Internet function (e.g., for streaming or otherwise viewing content on the Internet), a function for having a voice call, and a function for short message service (i.e., SMS) transmission, including Rapid SMS. Further, the portable terminal has used enhanced hardware and software to support various functions. That is, a conventional portable terminal supports execution of various application programs because portable terminals tend to comprise hardware having high processing capacity.

However, it is substantially impossible to optimize various variables occurring in a situation executing a function in hardware having the suitable size and software designed suited thereto. Accordingly, a portable terminal which includes hardware and software having high performance also causes various errors in a procedure associated with executing a specific function. Further, if an error occurs while the portable terminal is manufactured, then it may be corrected by a manufacturer or a designer. However, where the portable terminal is manufactured or sold, error correction by manufacturer or a designer is inevitably restrictive. A reset function of the portable terminal is added to solve the foregoing problem.

However, the reset function of the portable terminal may be supported according to the hardware size of each device. That is, because conventional portable terminals include components that cannot perform a manual reset function, there is a need for a design which supports the performing of a suitable reset function at a desired time point of the user regardless of specific attachment.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a reset circuit of a portable terminal which supports the performing of a reset function by adding a reset circuit to a portable terminal having a Power Management IC (PMIC) without a manual reset function, and a reset method thereof. The reset circuit added to the portable terminal includes simple devices.

In accordance with an aspect of the present invention, a reset circuit of a portable terminal is provided. The circuit includes an input unit for generating a certain input signal for reset according to a user input, a reset unit for generating a manual reset input signal according to an input of the certain input signal, for performing a control operation to cut-off power to be supplied to a Power Management IC (PMIC) using a signal generated during an operation maintenance time interval of the portable terminal and the manual reset input signal, and for performing a control operation to resupply the power to the PMIC according to an input signal from the input unit or completion of a preset timer, and a power supply unit for supplying the power.

In accordance with another aspect of the present invention, a reset method of a portable terminal is provided. The method includes generating and supplying a manual reset input signal to a reset control circuit by a reset circuit according to whether a certain input signal for reset is generated, performing a control operation to change a supply state of power to a Power Management IC (PMIC) to a cutting-off state by a reset control circuit to which a manual reset input signal is supplied when a signal having a high state generated during an operation maintenance time interval of the portable terminal and the manual reset input signal are generated, and resupplying the power to the PMIC according to an input signal for resupplying the power to the PMIC or a timer completion signal according to completion of a preset timer.

The method further includes supplying a high state signal to a first switch through a diode during an operation of the portable terminal before the manual reset input signal is generated to inactivate a first switch of a PNP type and to activate a second switch, and inactivating a third switch of a PNP type according to activation of the second switch to supply the power to the PMIC. Preferably, performing a control operation includes transferring a low state signal output from the reset circuit to the first switch to activate the first switch, and activating a second switch and inactivating a third switch connected to the second switch according to the activation of the first switch to block a path connected between the power and the PMIC.

In accordance with another aspect of the present invention, a portable terminal is provided. The portable terminal comprises an input unit for generating input signals based on a user input, a power supply for supplying power, a controller for controlling operations of the portable terminal, and a reset unit for operatively cutting-off power supplied to the controller if an input signal corresponds to a predefined signal associated with a manual reset operation.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
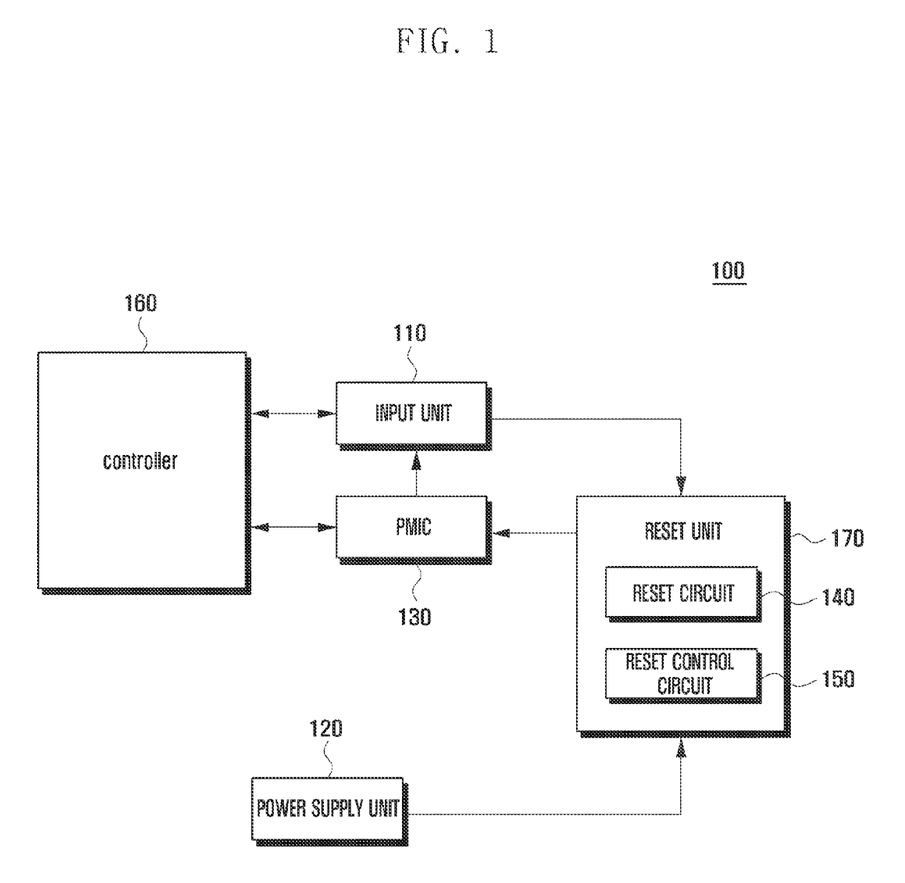
FIG. 1 is a block diagram illustrating a configuration of a portable terminal according to an exemplary embodiment of the present invention.

FIG. 1 is a schematic view illustrating structural elements associated with a reset function of a portable terminal according to an exemplary embodiment of the present invention.

Referring to FIG. 1, a portable terminal 100 includes an input unit 110, a power supply unit 120, a PMIC 130, a reset unit 170, and a controller 160. The reset unit 170 may include a reset circuit 140, a reset control circuit 150, and other circuit arrangements.

The portable terminal 100, having a construction as illustrated above, cuts-off and restarts power supply of the PMIC 130 to reset the portable terminal according to a certain input signal generated from the input unit 110. To cut-off and restart power supplied to the PMIC 130 so as to reset the portable terminal, the portable terminal 100 may control reset of the PMIC 130 using an input signal received from the input unit 110 and a reset control circuit 150 having an analog characteristic disposed between the PMIC 130 and the power supply 120. Hereinafter, respective structural elements will be described in detail.

The input unit 110 generates various input signals necessary for driving and operating the portable terminal 100. The input unit 110 may be configured so as to include at least one of a plurality of key buttons, a key pad, a touch pad, or a touch screen. Hereinafter, the input unit 100 will be described to have a plurality of key buttons. In a case where the input unit 110 is configured in the form of a key button, a user may apply pressure to a certain key button to generate a certain input signal. The input signal generated by the input unit 110 may be transferred to the controller 160, the reset circuit 140, and the reset control circuit 150. In particular, the input signal transferred to the reset circuit 140 and the reset control circuit 150 may become an input signal corresponding to a certain key button. For example, the input signal transferred to the reset circuit 140 and the reset control circuit 150 may become a signal created according to power key button input for controlling power turning-on/off of the portable terminal 100 and a signal created from at least one key button of other key buttons. Accordingly, a user of the portable terminal 100 may perform an operation simultaneously pushing a power key button and a certain key button of key buttons included in the input unit 110 of the portable terminal 100 operated to activate a manual reset function according to an exemplary embodiment of the present invention. For example, an input signal for supporting a manual reset function may be generated by simultaneous inputs of a power key button and a certain key button. However, the present invention is not limited thereto. The key buttons may be substituted by other key buttons according to intention of a designer designing an algorithm generating an input signal for activating the manual reset function. For example, various combinations of at least one key button and the timing with which input of the combination of at least one key button activates a manual reset function may be designated or defined by a designer of a specific portable terminal. The input signal for activating the manual reset function may be substituted by signals generated from key buttons and signals generated through a touch pad, a touch screen, or a side key. Accordingly, it will be appreciated that an input signal generated by the power key button and the certain key button is a certain input signal allotted to reset a manual.

The power supply unit 120 supplies power to the portable terminal 100. The power supply unit 120 may be designed so as to be in the form of an internal type power supply (e.g., a power supply which is integrated with the portable terminal) or an attaching type power supply (e.g., a power supply which operatively attaches or connects to the portable terminal) in the portable terminal 100. If the power supply unit 120 is designed so as to be of the attaching type, the portable terminal 100 is provided with a space for insertion of the power supply unit 120, and the portable terminal 100 further includes signal lines receiving power from the inserted power supply unit 120. For example, the portable terminal 100 may be configured with a housing in which an attaching type power supply 120 is inserted (e.g. installed), and connected to the portable terminal 100. The power supply unit 120 may be configured as a primary cell battery, a rechargeable secondary cell battery, or the like. The power supply unit 120 according to exemplary embodiments of the present invention may transfer power necessary for driving the portable terminal 100 to the PMIC 130 through the reset control circuit 150. Accordingly, power supplied from the power supply unit 120 may be transferred or cut-off to the PMIC 130 under the control of the reset unit (e.g., the power supplied from the power supply unit 120 may be transferred or cut-off to the PMIC 130 under control of the reset control circuit 150).

The PMIC 130 creates power of various forms capable of operating various elements of the portable terminal 100 using the power supplied from the power supply unit 120. For example, the PMIC 130 may create power necessary for driving the controller 160 and the input unit 110. The PMIC 130 may also create power for operating other elements of the portable terminal 100 such as, for example, a camera, a MP3 module, and a radio frequency unit. Because power created from the PMIC 130 is converted into a form of power necessary for driving respective elements of the portable terminal 100, the amplitude of power (e.g., amplitude of a voltage) transferred to the various respective elements may be changed. In particular, the PMIC 130 may cut-off power supply from the power supply unit 120 to turn-off the portable terminal 100, or the PMIC 130 may receive power from the power supply unit 120 to turn-on the portable terminal 100, and to change the portable terminal 100 from a turning-off state to a turning-on state to support a manual reset function of the portable terminal 100 under the control of the reset control circuit 150. According to an exemplary embodiment of the present invention, the PMIC 130 may not automatically support the manual reset function.

The reset circuit 140 is disposed between the input unit 110 and the reset control circuit 150. The reset circuit 140 creates a reset command according to a reset input signal from the input unit 110, and transfers the reset command to the reset control circuit 150. The reset circuit 140 may be configured in the form of a chip. An input terminal of the reset circuit 140 may connect with the input unit 110 and an output terminal thereof may connect with the reset control circuit 150. The reset circuit 140 according to an exemplary embodiment of the present invention is described in detail through the accompanying drawings.

The reset control circuit 150 is operatively disposed between the reset circuit 140 and the power supply unit 120, and between the power supply unit 120 and the PMIC 130. The reset control circuit 150 may perform a control operation to transfer or cut-off power supplied from the power supply unit 120 to the PMIC 130 according to an input signal from the input unit 110 and an output of the reset circuit 140 according thereto. When the reset control circuit 120 drives the portable terminal 100, the reset control circuit 120 may be configured to continuously transfer power from the power supply unit 120 to the PMIC 130. If an input signal for activating a reset function from the input unit 110 is transferred to the reset control circuit 150, then the reset control circuit 150 may temporarily cut-off or resupply power to the PMIC 130 to support reset of the portable terminal 100. The reset control circuit 150 may further include a counter or use an output of a separate counter (e.g., a counter provided at the portable terminal 100) so as to resupply cut-off power. For example, the reset control circuit 150 may resupply cut-off power after a predetermined period of time according to a counter. The reset control circuit 150 may perform a control operation to transfer battery power VBAT to the PMIC 130 according to a certain input signal. For example, the reset control circuit 150 may perform a control operation using a small number of switches (e.g., three switches). Accordingly, according to an exemplary embodiment of the present invention, the portable terminal 100 may minimize an analog error occurring according to arrangement of a plurality of switches and stabilize signal flow for reset control. A detailed circuit arrangement of the reset control circuit 150 will be described with reference to the accompanying drawings in detail.

The controller 160 performs a control operation for controlling various amplitudes and types of power provided from the PMIC 130 to respective elements of the portable terminal 100. While the portable terminal 100 is operating, the controller 160 may receive various input signals from the input unit 110, and perform a control operation to operate a currently activated application program according to a corresponding input signal. Because the controller 160 is disposed separately from the reset circuit 140 and the reset control circuit 150 of an exemplary embodiment of the present invention, the controller 160 may operate separately from a manual reset function. Nevertheless, if the controller 160 receives power from the PMIC 130, the controller 160 may perform an operation necessary for driving the portable terminal 100. Accordingly, if power of the power supply unit 120 supplied to the PMIC 130 is cut-off by the reset control circuit 150, an operation of the controller 160 may stop. As the power of the supply unit 120 supplied to the PMIC 130 is cut-off, the controller 160 may provide a counter output to the reset control circuit 150 to resupply power to the PMIC 130. The counter may be designed as a counter that operates although power supply from the power supply unit 120 temporarily stops. The counter may be disposed in the portable terminal 100 separate from the controller 160.

As illustrated previously, in a portable terminal 100 according to an exemplary embodiment of the present invention, a reset circuit 140 and a reset control circuit 150 are disposed between the input unit 110 and the power supply unit 120, and between the PMIC 130 and the power supply unit 120. Further, the portable terminal 100 may perform a manual reset by cutting-off power supply of the PMIC 130 according to an input signal from the input unit 110. Hereinafter, detailed elements of the reset circuit 140 and the reset control circuit 150 will be described with reference to the accompanying drawings in detail.

Figure 2:
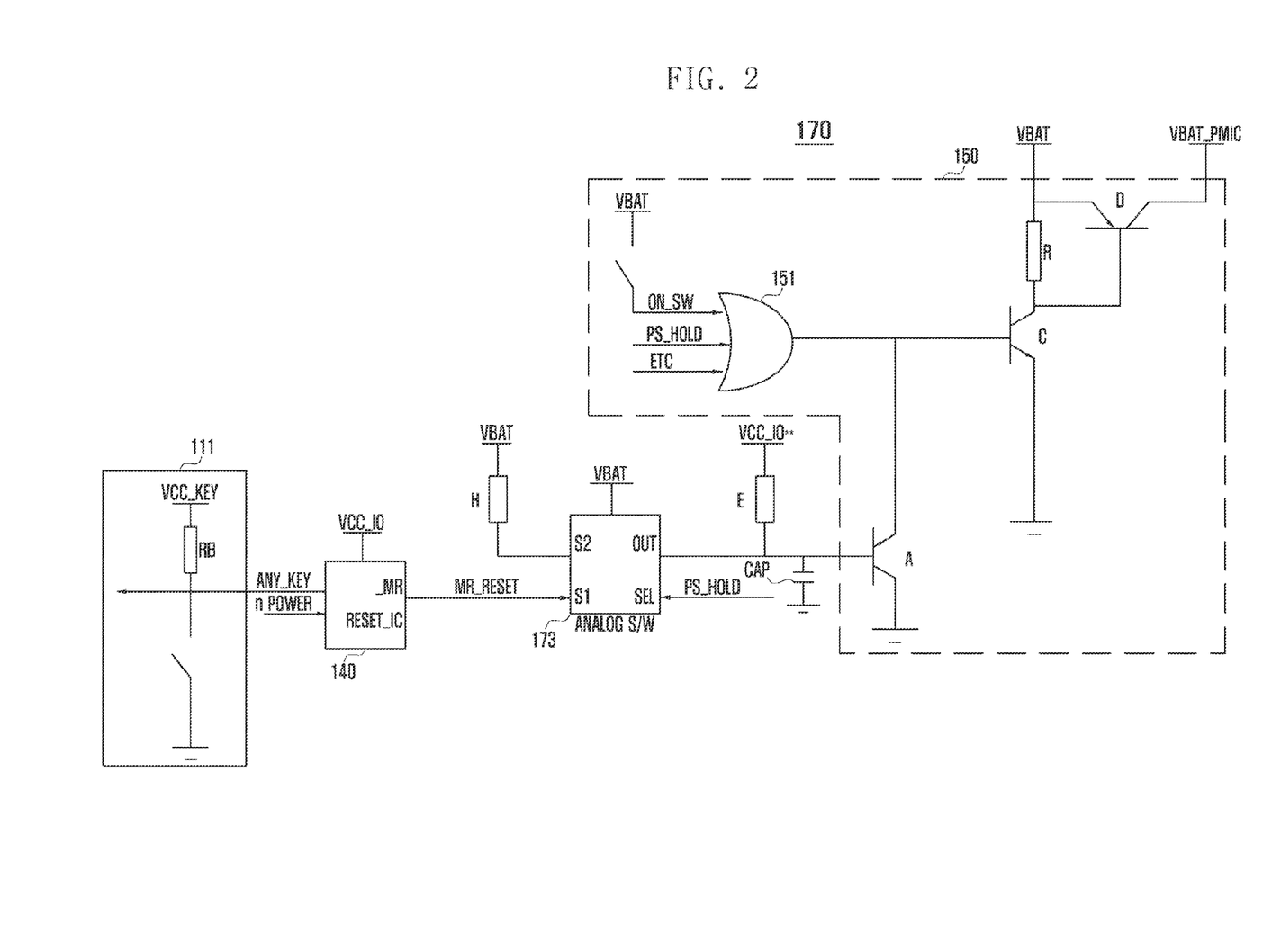
FIG. 2 is a circuitry diagram illustrating a circuit arrangement of a reset unit according to an exemplary embodiment of the present invention in detail.

FIG. 2 is a circuitry diagram illustrating a circuit arrangement of a reset unit 170 according to an exemplary embodiment of the present invention.

Referring to FIG. 2, a reset unit 170 may include a reset circuit 140, an analog switch 173 located at an output terminal of the reset circuit 140, and a reset control circuit 150 connected to an output terminal of the analog switch 173. A parallel connected pull-up resistor E, input/output power VCC_IO, and a parallel connected capacitor CAP may be disposed between the analog switch 173 and a first switch A of the reset control circuit 150.

The reset circuit 140 is driven by the input/output power VCC_IO. If a power key input signal nPower and a certain key input signal ANY_KEY from the input unit 100 are transferred to the reset circuit 140, the reset circuit 140 may transfer a manual reset signal MR_RESET to the analog switch 173. For example, the reset circuit 140 may transfer the manual reset signal MR_RESET to the analog switch 173 if a power key input signal nPower and a certain key input signal ANY_KEY (corresponding to the input of a predefined input to the input unit 100) are simultaneously transferred to the reset circuit 140. The input/output power VCC_IO is power that the PMIC 130 creates using, for example, battery power VBAT.

The analog switch 173 may include two selection input terminals S1 and S2, one output terminal OUT, and one selection terminal SEL. The analog switch 173 may be driven by input/output power VCC_IO provided from the PMIC 130 in the same manner as in the reset circuit 140. When a manual reset signal MR_RESET of the reset circuit 140 is generated, the selection input terminal S1 connecting with an output of the reset circuit 140 receives the manual reset signal MR_RESET. The second selection input terminal S2 connects with the battery power VBAT through a pull-up resistor H. While the portable terminal 100 is driven, a PS_HOLD signal having a continuously high state is input to the selection terminal SEL. When a separate input signal is not generated in the first selection input terminal S1, the analog switch 173 may output battery power VBAT from the second selection input terminal S2 to the reset control circuit 150 through an output terminal OUT. If the manual reset signal MR_RESET is input to the first selection input terminal S1, the analog switch 173 may output the manual reset signal MR_RESET to a first switch A of the reset control circuit 150 through the output terminal OUT. In this case, an output OUT of the analog switch 173 connects with a base of the first switch A of the reset control circuit 150. The input/output power VCC_IO and the pull-up resistor E are connected in parallel between the output terminal OUT and the first switch A.

In this case, when initial power is supplied or power is resupplied after reset, because the portable terminal 100 is not driven, a PS_HOLD signal is at a low level. Accordingly, the analog switch 173 may transfer battery power VBAT connected to the second selection input terminal S2 to a base of the first switch A to maintain a default high state. If power is supplied to change the PS_HOLD signal to a high state, an output terminal OUT of the analog switch 173 supports to supply an output of the first selection input terminal S1 to a first switch A. In this procedure, because the reset circuit 140 is in a state before generation of a manual reset signal, it maintains a high state. Because the input/output power VCC_IO connected to a base of the first switch A is also supplied through the pull-up resistor E, the first switch A may continuously maintain an inactive state before the manual reset signal MR_RESET is transferred to the first selection input terminal S1. In this case, the pull-up resistor E may prevent power supplied to the first switch A from being cut-off while power supplied from the analog switch 173. For example, because the analog switch 173 may have a break-before-make feature, without the pull-up resistor E providing power to the first switch A, the power supplied to the first switch A may otherwise be cut-off if the analog switch 173 is switched such that the power is turned on. In detail, when the PS_HOLD signal changes from a low state to a high state, the analog switch 173 performs a switching operation from the second selection input terminal S2 to the first selection input terminal S1. At this time, an electric current is temporarily cut-off in a side of an output terminal OUT of the analog switch 173. As a result, the first switch A may be turned-off in a moment if the PS_HOLD again changes to a low state. The pull-up resistor E prevents turning-on/off repetition of the first switch A from occurring due to a switch operation of the analog switch 173, and thus ensures that the switch A continuously maintains a turning-on state.

Meanwhile, input/output power VCC_IO supplied to the analog switch 173 may be configured by an LDO power source that is turned-on only when the portable terminal 100 is initially turned-on and is turned-off and maintains high impedance (High-Z) in a sleep mode. Through such a configuration, power of the analog switch 173 may be reduced in the sleep mode to improve generation of current consumption of a switch input/output port.

The capacitor CAP may be connected in parallel between an output terminal OUT of the analog switch 173 and a base of the first switch A. While power VBAT from the output terminal OUT of the analog switch 173 is supplied to the first switch A, the capacitor CAP may be charged with power and temporarily supply charged power to the first switch A at a predetermined time point. Accordingly, if the pull-up resistor E is not included in the circuit, the capacitor CAP may provide stability to the circuit regardless of whether the analog switch 173 has a break-before-make-feature. However, it may be necessary to design or configure the capacitor CAP such that the portable terminal 100 may maintain stable characteristics in various conditions in consideration of power on/off characteristics of the portable terminal 100, reset timing, and temperature characteristics of the first switch A and the capacitor CAP. Because the use of the pull-up resistor E in a repetitive power on/off state may be more efficient than the use of capacitor CAP, the capacitor CAP may be omitted if the pull-up resistor E is included in the circuit. When stability of the portable terminal 100 is considered, the capacitor CAP may be substituted by the pull-up resistor E or be added with the pull-up resistor E.

The reset control circuit 150 may include a first switch A, a second switch C, an OR gate 151 (or an OR-ING circuit), and a third switch D. An output of the reset circuit 140 is transferred to the first switch A. The second switch C is activated according to presence of activation of the first switch A. The OR gate transfers any one of certain signals generated from the portable terminal 100 to the second switch C. The third switch D performs a control operation to supply battery power VBAT to the PMIC 130 according to presence of activation of the second switch C. One terminal of the third switch D may connect with the power supply unit 120 and another terminal thereof may connect with the PMIC 130. Accordingly, the third switch D may operate according to a state of the second switch C to supply or cut-off battery power VBAT of the power supply unit 120 to the PMIC 130. The reset control circuit 150 may be configured to include OR gate 151 because various power-on events such as insertions of a charger and a USB jig may be operated in the same manner as in generation of an ON_SW signal. Here, a generation operation of the ON_SW signal may mean that a switch is operated to supply power due to generation of a signal according to a power key input.

The power key input signal nPower may use an inverting signal of a signal according to power key input such that the reset circuit 140 outputs a manual reset signal MR_RESET as a low signal. A PS_HOLD signal of inputs of the OR gate 151 is a signal that provides a continuous high state signal when the portable terminal 100 is operated. That is, because the PS_HOLD is a signal indicating that power supply is maintained, a high state signal is provided during an operation of the portable terminal 100. An ETC signal may be a signal corresponding to, for example, insertion of the charger or the USB jig, or a counter output as another input signal. In this case, the counter supports a counting function for power resupply to the PMIC. The counter may be included in the controller 150 or a counter provided at the portable terminal 100. In the meantime, the first switch A and the third switch D may be configured by a PNP type transistor, and the second switch C may be configured by an NPN type transistor. However, the present invention is not limited to the foregoing switch types. In other words, various switch types may be used as the switches.

When a built-in resistor is included in the first switch A, a voltage across a base-emitter of the first switch A is small such that electric current does not flow through the first switch A. Accordingly, because power is not supplied to the portable terminal 100, the pull-up resistor E is preferably configured by a form without built-in resistance.

The reset unit 170 according to an exemplary embodiment of the present invention having a configuration as illustrated above transfers a manual reset input signal generated from the key input circuit 111, namely, a power key input signal nPower and a certain key input signal ANY_KEY to the reset circuit 140. In this case, the key input circuit 111 is configured to supply key power VCC_KEY to the input unit 110. For example, button resistors RB may be connected to every key button in the key input circuit 111. An output terminal of the reset circuit 140 operatively connects with a base of the first switch A, and a pull-up resistor E and battery power VBAT are connected in parallel between an output terminal of the reset circuit 140 and a base of the first switch A.

Accordingly, when there is no output from the reset circuit 140, because battery power VBAT is supplied to a base of the first switch A as a default, the first switch A of a PNP type may maintain a turning-off state. If the first switch A maintains a turning-off state, a high signal is output from an OR gate 151 disposed at an input terminal of the reset control circuit 150 and transferred to a base of the second switch C. Then, the second switch C is activated due to an output of the OR gate 151 that is input to a base of the second switch C. As a result, a third switch D connected to a collector of the second switch C is operated to supply battery power VBAT to the PMIC 130. Accordingly, while the manual reset signal MR_RESET from an output terminal of the reset circuit 140 is not supplied to the base of the first switch A, the battery power VBAT is continuously supplied to the PMIC 130, and the PMIC 130 may create and supply various powers necessary for driving the portable terminal 100. In this case, key power VCC_KEY generated from the PMIC 130 is supplied to the input unit 110, and the input/output power VCC_IO is supplied to the reset circuit 140 to operate respective elements.

In the meantime, if a power key input signal nPower and a certain key input signal ANY_KEY from the input unit 110 are input to the reset circuit 140, the reset circuit 140 may transfer a manual reset signal MR_RESET having a low level to the base of the first switch A. Because a pull-up resistor R is connected to a signal line to which the manual reset signal MR_RESET is transferred in parallel, and battery power VBAT is connected to one terminal of the pull-up resistor E, as illustrated previously, while a manual reset signal MR_RESET of a low state is not generated, battery power VBAT is supplied to a base of the first switch A to maintain a turning-off state of the first switch A. If the manual reset signal MR_RESET is supplied to a base of the first switch A, the first switch A is activated, namely, turned-off. Accordingly, the second switch C cuts-off an electric current flow of the third switch D. Then, an output of an OR gate 151 is transferred to a ground terminal through the first switch A not through the second switch C, with the result that the second switch C may be changed to an inactivated state. The second switch C is inactivated, the battery power VBAT is inactivated due to a voltage applied to a third switch D of a PNP type a base of which connects with the battery power VBAT or a resistor R to cut-off supply of the battery power VBAT to the PMIC 130. In this case, a load resistor R is connected between the battery power VBAT and a collector of the second switch C such that the second switch C is activated to cause the third switch D to supply the battery power VBAT to the PMIC 130.

If power supply to the PMIC 130 is cut-off, the PMIC 130 stops supply of the input/output power VCC_IO or key power VCC_KEY, and accordingly stops supply of the input/output power VCC_IO for driving the reset circuit 140 stops. Accordingly, the reset circuit 140 cannot generate a separate output signal. In the meantime, if the battery is continuously connected with the portable terminal 100, the first switch A may be again changed to an inactivated state through the battery power VBAT and the pull-up resistor E. A separate counter output provided to support the manual reset function may be connected to the OR gate to activate the second switch C. As a result, after counting of the counter, the battery power VBAT may be transferred to the PMIC 130 to again power supply of the portable terminal 100. In this case, the separate counter may use any one of various counters provided at the portable terminal 100, or be separately allotted as an input of the OR gate 151 to generate an input signal after a predetermined time elapses. That is, the counter may be designed to counter a predetermined time after a certain key input signal ANY_KEY and a power key input signal nPower are generated. An ON_SW is connected with the OR gate 151 as a non-inverting signal of a power key input signal to activate the second switch C, with the result being that the battery power VBAT may be again supplied to the PMIC 130.

Meanwhile, the battery power VBAT may be used as power of the PMIC 130 and VBAT_PMIC power being input source of a PMIC BUCK converter and a Low Drop Out (LDO). The power key input signal nPower may become an inverting signal that is generated suited to Input/Output (IO) level of a corresponding portable terminal by a PMIC 130 to which an ON_SW is input. Accordingly, a low input of the power key input signal nPower and a low input of a certain key input signal ANY_KEY are supplied to the reset circuit 140, and the reset circuit 140 supplies a low output to a base of the first switch A.

As illustrated previously, the reset unit 170 according to an exemplary embodiment of the present invention may support a reset function of the portable terminal 100 to a PMIC 130 without supporting a manual reset function through cutting-of power supply. Before an input signal for manual reset is generated using battery power VBAT and a pull-up resistor E, the reset unit 170 may perform a control operation to supply the battery power VBAT to the PMIC 130. Then, after the portable terminal 100 is changed to a turning-off state, the reset unit 170 may support a default voltage to be changed to a turning-on state. In this case, only if the first switch A uses a small signal transistor without an internal built-in resistor, will the foregoing design or construction may be normally operated.

In the meantime, in the circuit arrangement illustrated in FIG. 2, if a potential difference between an output of the OR gate 151 and an output of the analog switch 173 is greater than that of base-collector for turning-on the first switch A, the first switch A may be turned-on. As a result, because an output of the OR gate 151 is provided to a ground terminal through the first switch A, the second switch C may not be activated. In this case, although the foregoing operation state is not a situation intended by the user, the portable terminal 100 may determine such an occurrence to be a reset operation. This situation may intermittently occur. For example, in the reset unit 170, an output of the OR gate 151 may be increased according to a ripple optionally occurring in a certain circuit or influence of another power terminal. Accordingly, a potential difference between an output of the OR gate 151 and base power of the first switch A may become greater than a potential difference of base-collector for turning-on the first switch A. In other words, as illustrated previously, there may arise a problem in the portable terminal 100 of the present invention that an undesirable reset operation occurs. To prevent this occurrence, a reset unit 170 of the present invention may include a diode B having a predetermined characteristic connected between an output terminal of the OR gate 151 and the first switch A as illustrated in FIG. 3.

Figure 3:
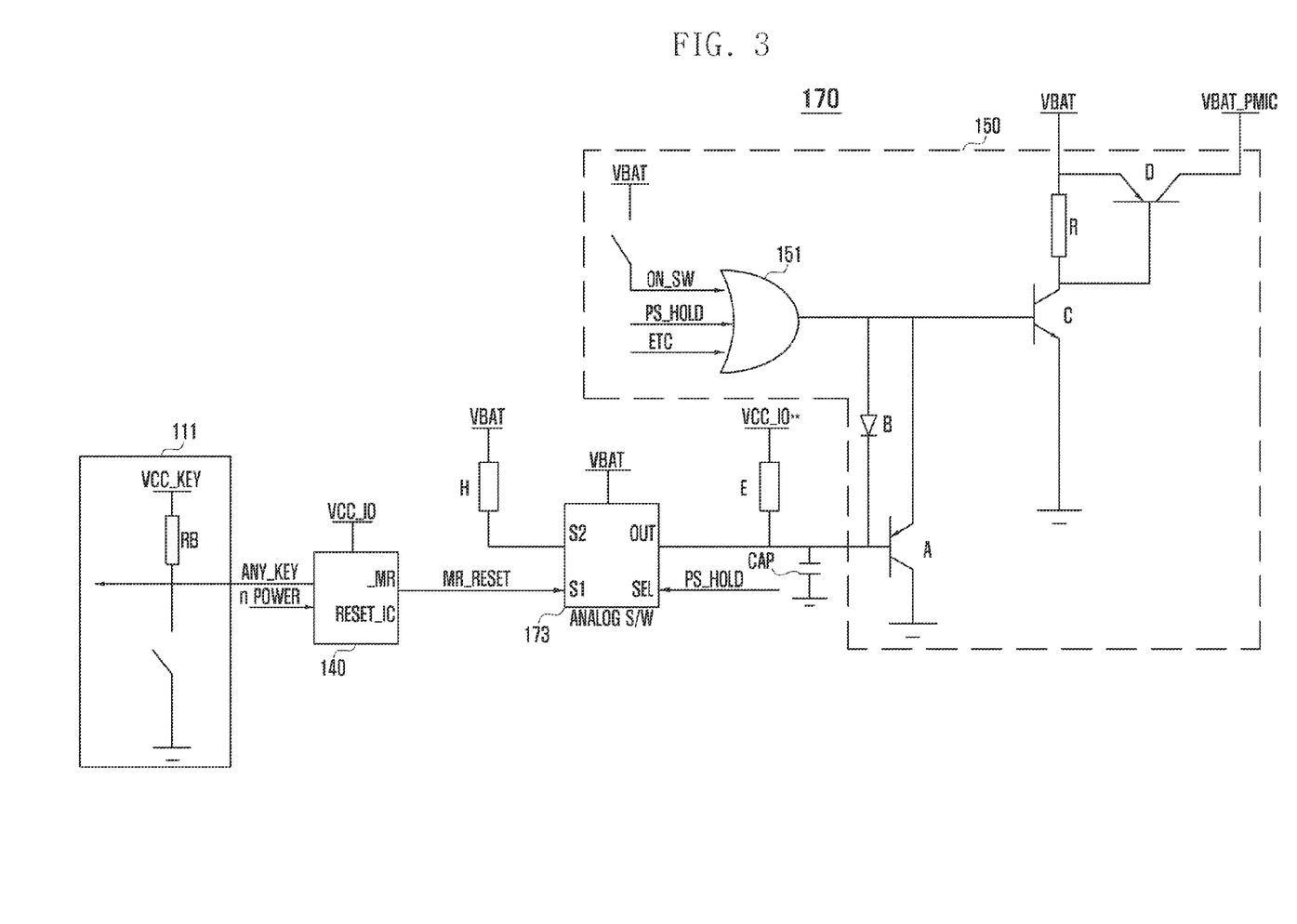
FIG. 3 is a circuitry diagram illustrating a circuit arrangement of a reset unit according to another exemplary embodiment of the present invention.

FIG. 3 is a circuitry diagram illustrating a circuit arrangement of a reset unit 170 for preventing an erroneous reset operation according to another exemplary embodiment of the present invention in detail. Because a circuit shown in FIG. 3 has substantially the same configuration as that of the reset circuit 170 shown in FIG. 2, a detailed description of other constructions except for a construction for preventing an erroneous reset operation is omitted.

Referring to FIG. 3, because an output of the OR gate 151 has various values such as ON_SW, PS_HOLD, and ETC in the reset unit 170, as illustrated previously, a potential difference between a base input voltage of the first switch A and an output voltage level of the OR gate 151 may become greater than a base-collector voltage being a turning-on voltage level of the first switch A. To prevent this, the reset unit 170 may include a diode B disposed to forward a current direction from an output of the OR gate 151 to a base input of the first switch A as shown. Thus, in contrast to the circuit illustrated in FIG. 2, the circuit illustrated in FIG. 3 includes a diode B connected between an output terminal of the OR gate 151 and the first switch A. As illustrated previously, if the diode B is connected between the OR gate 151 and the first switch A, a reset signal of the reset circuit 141 is generated to maintain a potential difference between an output of the OR gate 151 and a base input voltage of the first switch A at a forward voltage drop level of the diode B before a base of the first switch A is changed to a low state. Accordingly, a base-collector voltage for turning-on the first switch A may be less than a voltage applied to the base of the first switch A to prevent change in an unexpected off state of a set or the occurrence of an unexpected reset.

In detail, when an output terminal of the OR gate connects with a base of the first switch A through a diode B, an output of the OR gate 151 is supplied to a base of the first switch A. That is, while the portable terminal 100 maintains a turning-on state, a PS_HOLD signal is continuously supplied to a base of the first switch A to maintain a base of the first switch A at a high state. As a result, as a first switch A of a PNP type maintains a turning-off state, an output signal of the OR gate 151 may be supplied to the second switch C. Accordingly, a third switch D connected to the second switch C is activated to supply battery power to the PMIC 130, so that the portable terminal 100 may perform a normal operation.

In the meantime, when the user creates an input signal for reset using a key input circuit 111 provided at an input unit 110 to reset the portable terminal 100, the reset circuit 140 generates and provides a reset signal MR_RESET corresponding to an input signal provided from the key input circuit 111 to the base of the first switch A. In this case, because a reset signal MR_RESET is supplied to a base of the first switch A is a low state signal, a first switch A of a PNP type may be changed to a turning-on state. Accordingly, a signal output from the OR gate 151 is supplied to a ground terminal through the first switch A to turn-of the second switch C, and accordingly the third switch D is turned-off to stop supply of the battery power VBAT to the PMIC 130. Accordingly, the portable terminal 100 may be turned-off. Next, the user creates an ON_SW signal to turn-on the portable terminal 100, a high state signal according to an operation completion of a timer previously set for reset is output through the OR gate 151, and the ON_SW signal or the high state signal may be supplied to a base of the first switch A through a diode B.

In the meantime, the first switch A is activated or inactivated according to an output of the OR gate 151 regardless of circuit elements such as the pull-up resistor E, the battery power source VBAT, and a capacitor CAP. Accordingly, the reset unit 170 may be designed to have only structural elements without the pull-up resistor E, the battery power VBAT, and the capacitor CAP. In this case, the pull-up resistor E and the capacitor CAP may be disposed to prevent power from being cut-off while power is turned-on due to break-before-make-feature.

Figure 4:
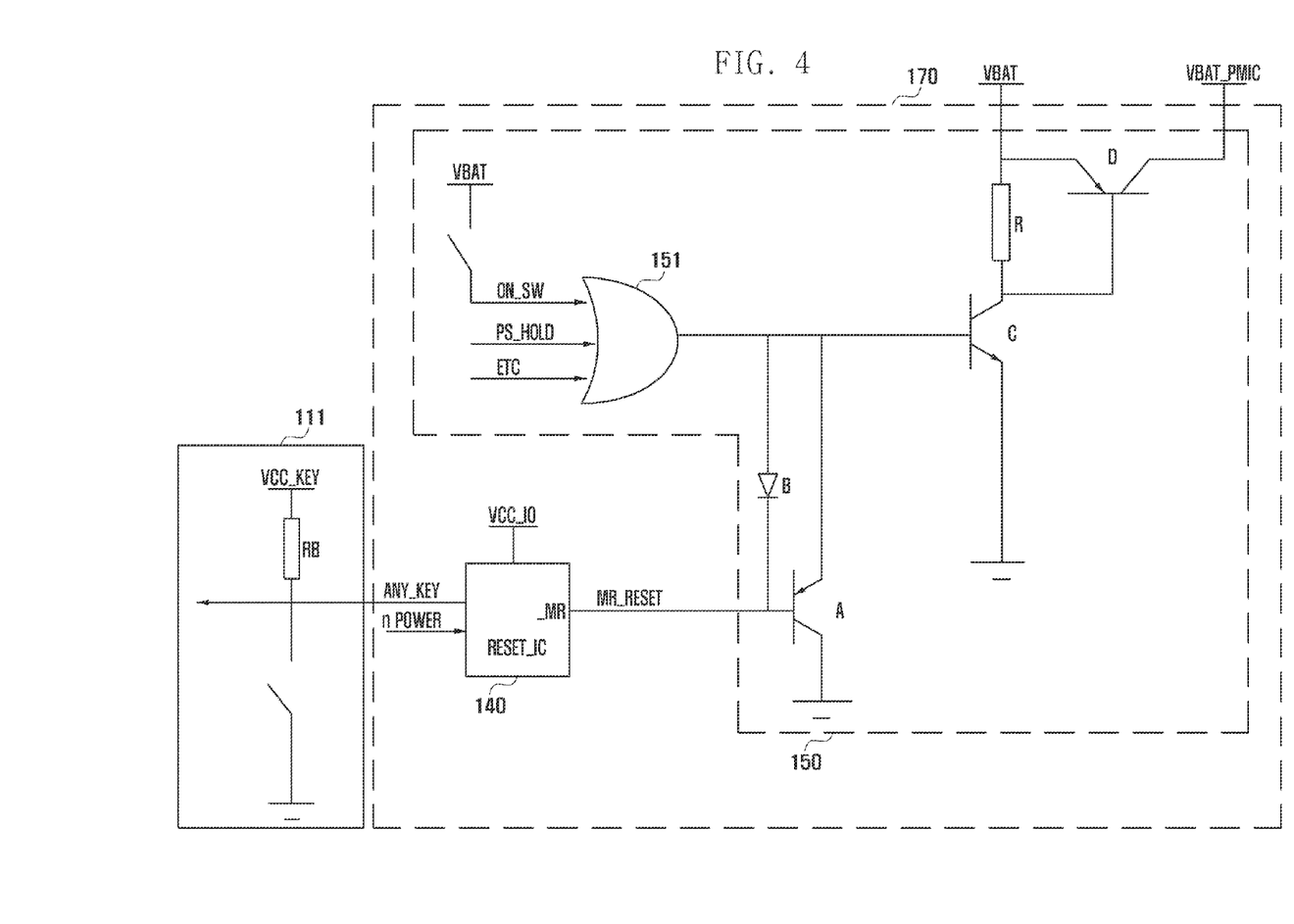
FIG. 4 is a circuitry diagram illustrating a circuit arrangement of a reset unit having a structure simpler than the structure shown FIG. 3 according to an exemplary embodiment of the present invention.

FIG. 4 is a circuitry diagram illustrating a circuit arrangement of a reset unit having a structure simpler than the structure shown FIG. 3 according to an exemplary embodiment of the present invention.

As shown in FIG. 4, the pull-up resistor E, the battery power VBAT, and the capacitor CAP, which are included in the circuit arrangement illustrated in FIG. 3, are omitted. An analog switch 173 may be additionally omitted due to a function of the diode B. That is why supply of power of the key input circuit, which is an input signal of the reset circuit 140, may be temporarily cut-off after generation of the reset signal MR_RESET so as to maintain the first switch A in a turning-off state. Accordingly, although the pull-up resistor E and the capacitor CAP have the same function as that of the diode B in the portable terminal 100 of the exemplary embodiment of the present invention, a reset unit 170 reinforcing characteristics of respective circuit elements using the pull-up resistor E and the capacitor CAP may be provided.

As illustrated earlier, in the reset unit 170 according to an exemplary embodiment of the present invention, the number of switches, namely, transistors used in the reset controller 150 is optimized to have characteristics robust to a current bias problem or various circuit characteristic problems caused by analog characteristics of a transistor and to simply configure an analog switch 173 and peripheral circuits for preventing leakage current added to the reset unit 170 and for implementing an operation, thereby widening a mounting space on a mounted circuit board and reducing a material cost.

The portable terminal 100 may further include various additional modules according to its provision form. That is, when the portable terminal 100 is a communication terminal, it may include structural elements such as, for example, a near distance communication module for near distance communication, a camera module for taking images (e.g., still and/or moving images), an interface for data transmission/reception in a wired communication scheme or a wireless communication scheme of the portable terminal 100, an Internet communication module for communicating with an Internet to perform an Internet function, a digital broadcasting module for performing digital broadcasting reception and playback functions which are not described. However, the portable terminal 100 may include structural elements equivalent to the foregoing structural elements. Further, because the structural elements can be changed according to converging trends of a digital device, certain elements may be omitted from the foregoing elements or may be substituted by other elements in the portable terminal 100. This will be easily understood to those of skill in the art.

Meanwhile, the portable terminal 100 may include devices of various types having a Wi-Fi module. For example, the portable terminal 100 may include all information and communication devices and multi-media devices, and application devices thereof. For example, the portable terminal may include various information communication devices and multi-media devices such as Portable Multimedia Player (PMP), Personal Digital Assistant (PDA), music player (e.g., MP3 player), and a portable game terminal, smart phone, notebook computer, and handheld PC, and application devices thereof as well as mobile communication terminal operating based on respective communication protocols corresponding to various communication systems.

As illustrated previously, in a reset circuit and a reset method of a portable terminal, a terminal without a separate manual reset function may also operate a reset function of a portable terminal according to generation of a preset certain signal input by mounting a reset circuit composed of simple circuit elements.

While the invention has been shown and described with reference to certain exemplary embodiments thereof, it will be understood by those skilled in the art that various changes in form and details may be made therein without departing from the spirit and scope of the invention as defined by the appended claims and the equivalents.

What is claimed is:

1. A circuit of a portable terminal, the circuit comprising:
   an input unit for generating a certain input signal for reset according to a user input;
   a reset unit for generating a manual reset input signal according to an input of the certain input signal, for performing a control operation to cut-off power to be supplied to a Power Management IC (PMIC) using a signal generated during an operation maintenance time interval of the portable terminal and the manual reset input signal, and for performing a control operation to resupply the power to the PMIC according to at least one of an input signal from the input unit and completion of a preset timer; and
   a power supply unit for supplying the power.

2. The circuit of claim 1, wherein the reset unit comprises:
   a reset circuit for generating the manual reset input signal according to the input of the certain input signal; and
   a reset control circuit including a plurality of switches for cutting-off power to be supplied to the PMIC according to the manual reset input signal and the certain input signal, and for controlling supply of the power to the PMIC according to at least one of the input signal of the input unit and the completion of the timer.

3. The circuit of claim 2, wherein the reset control circuit comprises:
   a first switch activated according to an output of the reset circuit and configured so as to not include a built-in resistor;
   an OR gate outputting various input signals of the portable terminal, an output terminal of the OR gate operatively connecting with the first switch;
   a second switch operatively connecting with the output terminal of the OR gate and activated according to whether the first switch is activated; and
   a third switch for controlling supply or cutting-off of the power to the PMIC according to whether the second switch is activated.

4. The circuit of claim 3, wherein the reset control circuit comprises a diode operatively connected between the output terminal of the OR gate and a base of the first switch.

5. The circuit of claim 4, wherein the first switch and the third switch of the reset control circuit are configured by a PNP type, the second switch is configured by an NPN type, and a current output direction of the diode is arranged in a direction of a base of the first switch in the output terminal of the OR gate.

6. The circuit of claim 3, wherein the OR gate outputs an input signal of a high state to a base of the second switch when at least one of an input signal having a high state while the portable terminal is operated; an input signal of an input unit having a high state input to instruct power supply of the portable terminal; and another input signal having a high state input according to at least one of insertion of a charger, a USB input, and a counter input is input to the OR gate.

7. The circuit of claim 2, wherein the reset unit further comprises:
   an analog switch disposed between the reset circuit and the reset control circuit;
   a pull-up resistor disposed between the reset circuit and the reset control circuit, one terminal of the pull-up resistor connecting with input/output power generated by the PMIC; and
   a capacitor disposed between the reset circuit and the reset control circuit.

8. The circuit of claim 7, wherein the analog switch comprises:
   a first selection input terminal to which an output of the reset circuit is input;
   a second selection input terminal to which a pull-up resistor having one terminal connected with the power is connected;
   a selection terminal to which a high state signal is input if the portable terminal is operated and a low state signal is input if an operation of the portable terminal stops; and
   an output terminal supplying a signal input to the first selection input terminal or the second selection input terminal to the reset control circuit according to a state of the signal input to the selection terminal.

9. A reset method of a portable terminal, the method comprising:
   generating and supplying a manual reset input signal to a reset control circuit by a reset circuit according to whether a certain input signal for reset is generated;
   performing a control operation to change a supply state of power supplied to a Power Management IC (PMIC) to a cutting-off state by a reset control circuit to which a manual reset input signal is supplied when a signal having a high state generated during an operation maintenance time interval of the portable terminal and the manual reset input signal are generated; and
   resupplying the power to the PMIC according to at least one of an input signal for resupplying the power to the PMIC and a timer completion signal according to completion of a preset timer.

10. The method of claim 9, further comprising:
    supplying a high state signal to a first switch through a diode during an operation of the portable terminal before the manual reset input signal is generated to inactivate a first switch of a PNP type and to activate a second switch; and
    inactivating a third switch of a PNP type according to activation of the second switch to supply the power to the PMIC.

11. The method of claim 10, wherein performing a control operation comprises:
    transferring a low state signal output from the reset circuit to the first switch to activate the first switch; and
    activating a second switch and inactivating a third switch connected to the second switch according to the activation of the first switch to block a path connected between the power and the PMIC.

12. A portable terminal, the terminal comprising:
    an input unit for generating input signals based on a user input;
    a power supply for supplying power;
    a controller for controlling operations of the portable terminal; and
    a reset unit for operatively cutting-off power supplied to the controller if an input signal corresponds to a predefined signal associated with a manual reset operation and for operatively resupplying the power supplied to the controller according to at least one of the input signal from the input unit and completion of a preset timer.

13. The terminal of claim 12, further comprising:
    a Power Management IC (PMIC) which is operatively connected to the power supply and the controller and which provides power for driving the controller.

14. The terminal of claim 13, wherein the reset unit comprises:
    a reset control circuit which comprises an input for receiving an input signal, and a plurality of switches for controlling power supplied to the PMIC according to whether the input signal received by the reset control unit corresponds to a signal generated if the user input corresponds to the predefined signal associated with the manual reset operation.

15. The terminal of claim 14, wherein the reset control circuit comprises:
   a first switch activated according to a predefined user input and configured so as to not include a built-in resistor;
   an OR gate outputting various input signals of the portable terminal, an output terminal of the OR gate operatively connecting with the first switch;
   a second switch operatively connecting with the output terminal of the OR gate and activated according to whether the first switch is activated; and
   a third switch for controlling supply or cutting-off of the power to the PMIC according to whether the second switch is activated.

16. The terminal of claim 15, wherein the reset control circuit comprises a diode operatively connected between the output terminal of the OR gate and a base of the first switch.

17. The terminal of claim 15, wherein the first switch and the third switch of the reset control circuit are configured by a PNP type, the second switch is configured by an NPN type, and a current output direction of the diode is arranged in a direction of a base of the first switch in the output terminal of the OR gate.

18. The terminal of claim 15, wherein the OR gate outputs an input signal of a high state to a base of the second switch when at least one of an input signal having a high state while the portable terminal is operated; an input signal of an input unit having a high state input to instruct power supply of the portable terminal; and another input signal having a high state input according to at least one of insertion of a charger, a USB input, and a counter input is input to the OR gate.

19. The terminal of claim 14, wherein the reset unit further comprises:
   a reset circuit for generating a manual reset input signal if a user input corresponds to a predefined signal associated with a manual reset operation; and
   an analog switch disposed between the reset circuit and the reset control circuit;
   a pull-up resistor disposed between the reset circuit and the reset control circuit, one terminal of the pull-up resistor connecting with input/output power generated by the PMIC; and
   a capacitor disposed between the reset circuit and the reset control circuit.

20. The terminal of claim 19, wherein the analog switch comprises:
   a first selection input terminal to which an output of the reset circuit is input;
   a second selection input terminal to which a pull-up resistor having one terminal connected with the power is connected;
   a selection terminal to which a high state signal is input if the portable terminal is operated and a low state signal is input if an operation of the portable terminal stops; and
   an output terminal supplying a signal input to the first selection input terminal or the second selection input terminal to the reset control circuit according to a state of the signal input to the selection terminal.

* * * * *